(12) United States Patent
Kim et al.

(10) Patent No.: US 7,623,385 B2
(45) Date of Patent: Nov. 24, 2009

(54) METHOD OF READING FLASH MEMORY DEVICE FOR DEPRESSING READ DISTURB

(75) Inventors: Nam Kyeong Kim, Icheon-si (KR); Ju Yeab Lee, Icheon-si (KR); Keum Hwan Noh, Seoul (KR)

(73) Assignee: Hynix Semiconductor Inc., Icheon-shi (KR)

( * ) Notice: Subject to any disclaimer, the term of this patent is extended or adjusted under 35 U.S.C. 154(b) by 80 days.

(21) Appl. No.: 11/965,191

(22) Filed: Dec. 27, 2007

(65) Prior Publication Data

US 2008/0298127 A1 Dec. 4, 2008

(30) Foreign Application Priority Data

Jun. 1, 2007 (KR) .................... 10-2007-0053752

(51) Int. Cl.
*G11C 11/34* (2006.01)

(52) U.S. Cl. ................ 365/185.17; 365/185.18; 365/185.24; 365/185.25; 365/185.26; 365/185.27; 365/185.28

(58) Field of Classification Search ............ 365/185.24, 365/185.25, 185.26, 185.27, 185.28, 185.17, 365/185.18
See application file for complete search history.

(56) References Cited

U.S. PATENT DOCUMENTS

| | | | | |
|---|---|---|---|---|
| 5,768,188 | A * | 6/1998 | Park et al. | ............... 365/185.03 |
| 6,240,016 | B1 | 5/2001 | Haddad et al. | |
| 6,611,460 | B2 * | 8/2003 | Lee et al. | ............... 365/185.18 |
| 6,975,542 | B2 | 12/2005 | Roohparvar | |
| 7,064,981 | B2 | 6/2006 | Roohparvar | |

FOREIGN PATENT DOCUMENTS

JP 2002-358792 12/2002

\* cited by examiner

*Primary Examiner*—Anh Phung
*Assistant Examiner*—Tha-O Bui
(74) *Attorney, Agent, or Firm*—Marshall, Gerstein & Borun LLP

(57) ABSTRACT

Provided is a method of reading a flash memory device for depressing read disturb. According to the method, a first voltage is applied to a gate of the drain select transistor to turn on the drain select transistor, and a read voltage is applied to a gate of a selected transistor among the plurality of memory cells. Then, a pass voltage is applied to gates of unselected transistors among the plurality of memory cells. Furthermore, when the pass voltage is applied, a first pass voltage is applied and then a second pass voltage is applied after an elapse of a predetermined time following the applying of the first pass voltage. The second pass voltage has a level different from that of the first pass voltage.

20 Claims, 4 Drawing Sheets

METHOD OF READING FLASH MEMORY DEVICE FOR DEPRESSING READ DISTURB

CROSS-REFERENCE TO RELATED APPLICATIONS

The present application claims priority to Korean patent application number 10-2007-0053752, filed on Jun. 1, 2007, which is incorporated by reference in its entirety.

BACKGROUND OF THE INVENTION

The present invention relates to a method of reading a flash memory device, and more particularly, to a method of reading a flash memory device for depressing read disturb.

A flash memory device is widely used in diverse electronic applications for non-volatile memory devices. A flash memory device utilizes one transistor cell, and is therefore able to provide high memory density and reliability and low power consumption. A flash memory device is used in portable computers, personal digital assistants (PDAs), digital cameras, mobile phones, etc. Also, program codes, system data such as a basic input/output system (BIOS), and firmware can be programmed into flash memory devices. Among flash memory devices, NAND flash memory devices have high memory density at a relatively low cost, so that the range of its applications is gradually expanding.

As illustrated in FIG. 1, a memory cell of a NAND flash memory device includes a plurality of cell strings. A cell string 100 includes a drain select transistor 110, a plurality of memory cells 131, 132, 133, and 134, and a source select transistor 120, which are all connected in series. A drain of the drain select transistor 110 is connected to a bit line BL, and its source is connected to a drain of the memory cell 131. A gate of the drain select transistor 110 is connected to a drain select line DSL. Gates of the memory cells 131, 132, 133, and 134 are respectively connected to word lines WL1, WL2, WL3, and WL4. A drain of the source select transistors 120 is connected to a source of the memory cell 134, and its drain is connected to a common source line CSL. A gate of the source select transistor 120 is connected to a source select line SSL. The drain select transistor 110 and the source select transistor 120 are conventional MOS transistors, and the memory cells 131, 132, and 133 are floating gate transistors.

The memory cells 131, 132, 133, and 134 have an erased state or a programmed state, respectively, according to their threshold voltages. The memory cells in an erased state have a relatively low threshold voltage, e.g., lower than approximately ground voltage, for example 0 V. On the other hand, the memory cells in a programmed state have a relatively high threshold voltage, e.g., higher than approximately ground voltage, for example 0 V. A read operation that determines which state the memory cell is in applies a read voltage, e.g., approximately ground voltage, for example 0 V, to a word line of the selected memory cell and then determines whether the selected memory cell maintains a turned-on or a turned-off state. That is, if the selected memory cell is turned on, the selected memory cell is in an erased state because its threshold voltage is lower than a read voltage. On the other hand, if the selected memory cell is turned off, the selected memory cell is in a programmed state because its threshold voltage is higher than a read voltage.

Due to the repeated read operations, a read disturb phenomenon may occur. In the read disturb phenomenon, the threshold voltage of an erased memory cell abnormally increases, and this is read as a programmed state instead of an erased state. There are various factors that cause the read disturb phenomenon, and one of them is hot carriers.

Specifically, as illustrated in FIG. 2, while reading a memory cell 132, a read voltage Vread of approximately ground voltage, for example 0 V is applied to a word line WL2 of a selected memory cell, and a pass voltage Vpass of approximately 5 V higher than the read voltage Vread is applied to word lines WL3 and WL4 of the remaining transistors, i.e., the unselected memory cells 133 and 134. Due to the pass voltage Vpass applied to the word line WL3, channel boosting occurs at the unselected memory cell 133 adjacent to the selected memory cell 132. Accordingly, referring to arrows 241 and 242, strong horizontal and vertical electric fields are formed. Due to the horizontal and vertical electric fields, as illustrated in the arrow 243, electrons forming an off-leakage current at the channel of the selected memory cell 132 become hot carriers with high energy and then are injected to a floating gate FG of the unselected memory cell 133 adjacent to the selected memory cell 132. Then, a threshold voltage of the memory cell 133 increases, such that the memory cell 133 abnormally changes from an erased state into a programmed state.

As described above, the read disturb phenomenon due to the hot carriers occurs, because the pass voltage, e.g., of approximately 5 V, is applied to the drain select line DLS of the drain select transistor 110 of FIG. 1, and a pass voltage, e.g., of approximately 5 V, is simultaneously applied to the word line WL3 of the unselected memory cell 133. Since the pass voltage is simultaneously applied to the drain select line DSL of the drain select transistor 110 and the word line WL3 of the memory cell 133, the channel boosting occurs in a channel region of the memory cell 133, and the vertical and horizontal electric fields are formed due to the channel boosting.

SUMMARY OF THE INVENTION

Embodiments of the present invention are directed to a method of reading a flash memory device for depressing read disturb.

In one embodiment, a method for reading a NAND flash memory device with a cell string, the cell string including a drain select transistor, a plurality of memory cells, and source select transistor, which are all connected in series, includes: applying a first voltage to a gate of the drain select transistor to turn on the drain select transistor; applying a read voltage to a gate of a selected transistor among the plurality of memory cells; and applying a pass voltage to gates of unselected transistors among the plurality of memory cells. The applying of the pass voltage includes: applying a first pass voltage; and applying a second pass voltage after an elapse of a predetermined time following the applying of the first pass voltage, the second pass voltage having a level different from that of the first pass voltage.

The first pass voltage may be simultaneously applied when the first voltage is applied to turn on the drain select transistor.

A level of the second pass voltage may be set to be higher than that of the first pass voltage.

The first pass voltage may turn on the unselected memory cells and may be in a range that prevents hot carriers from occurring in a channel of the selected memory cell.

The first pass voltage may be set to be between about 1.5 V and about 4 V.

The applying of the first pass voltage may last between about 10 ns and about 0.1 ms.

The method may further include applying a second voltage to a gate of the source select transistor to turn on the source select transistor.

The second pass voltage may be applied before the second voltage is applied to turn on the source select transistor.

The method may further include: applying a precharge voltage to a selected bit line connected to a cell string including the selected memory cell; and applying about ground voltage, for example 0 V to unselected bit lines connected to remaining cell strings except for the cell string including the selected memory cell.

The precharge voltage may be set to be between about 0.5 V and about 7 V.

In another embodiment, a method for reading a NAND flash memory device with a cell string, the cell string including a drain select transistor, a plurality of memory cells, and a source select transistor, which are all connected in series, the drain select transistor including a cell string connected to each bit line, includes: applying a precharge voltage to a selected bit line, the selected bit line being connected to a cell string including a selected memory cell; applying about ground voltage, for example 0 V to remaining bit lines except for the selected bit line; applying a first voltage to a gate of the drain select transistor to turn on the drain select transistor; applying a read voltage to a gate of a selected memory cell among the plurality of memory cells; and applying a pass voltage to each gate of unselected memory cells among the plurality of memory cells to turn on the unselected memory cells. The applying of the pass voltage includes: applying a second pass voltage after an elapse of a predetermined time following the applying of the first pass voltage, the second pass voltage having a level different from that of the first pass voltage; applying a second voltage to a gate of the source select transistors to turn on the source select transistor; and detecting a voltage change of the selected bit line to determine whether the selected memory cell is in a programmed state or an erased state.

The first pass voltage may be simultaneously applied when the first voltage is applied to turn on the drain select transistor.

A level of the second pass voltage may be set to be higher than that of the first pass voltage.

The first pass voltage may turn on the unselected memory cells and may be in a range that prevents hot carriers from occurring in a channel of the selected memory cell.

The first pass voltage may be set to be between about 1.5 V and about 4 V.

The second pass voltage may be applied before the second voltage is applied to turn on the source select transistor.

In another embodiment, A method for reading a NAND flash memory device with a cell string, the cell string including a drain select transistor, a plurality of memory cells, and a source select transistor, which are all connected in series, the drain select transistor including a cell string connected to each bit line, the method comprising: applying a precharge voltage to a selected bit line, the selected bit line being connected to a cell string including a selected memory cell; applying ground voltage to remaining bit lines except for the selected bit line; applying a first voltage to a gate of the drain select transistor to turn on the drain select transistor; applying a read voltage to a gate of a selected memory cell among the plurality of memory cells; and applying a pass voltage to each gate of unselected memory cell among the plurality of memory cells to turn on the unselected memory cell. The applying of the pass voltage includes: applying a second pass voltage after an elapse of a predetermined time following the applying of the first pass voltage, the second pass voltage is higher than that of the first pass voltage; applying a second voltage to a gate of the source select transistors to turn on the source select transistor; and detecting a voltage change of the selected bit line to determine whether the selected memory cell is in a programmed state or an erased state.

The first pass voltage may be simultaneously applied when the first voltage is applied to turn on the drain select transistor.

The first pass voltage may turn on the unselected memory cells and is in a range that prevents hot carriers from occurring in a channel of the selected memory cell.

The first pass voltage may be set to be between about 1.5 V and about 4 V.

DESCRIPTION OF SPECIFIC EMBODIMENTS

Figure 1:
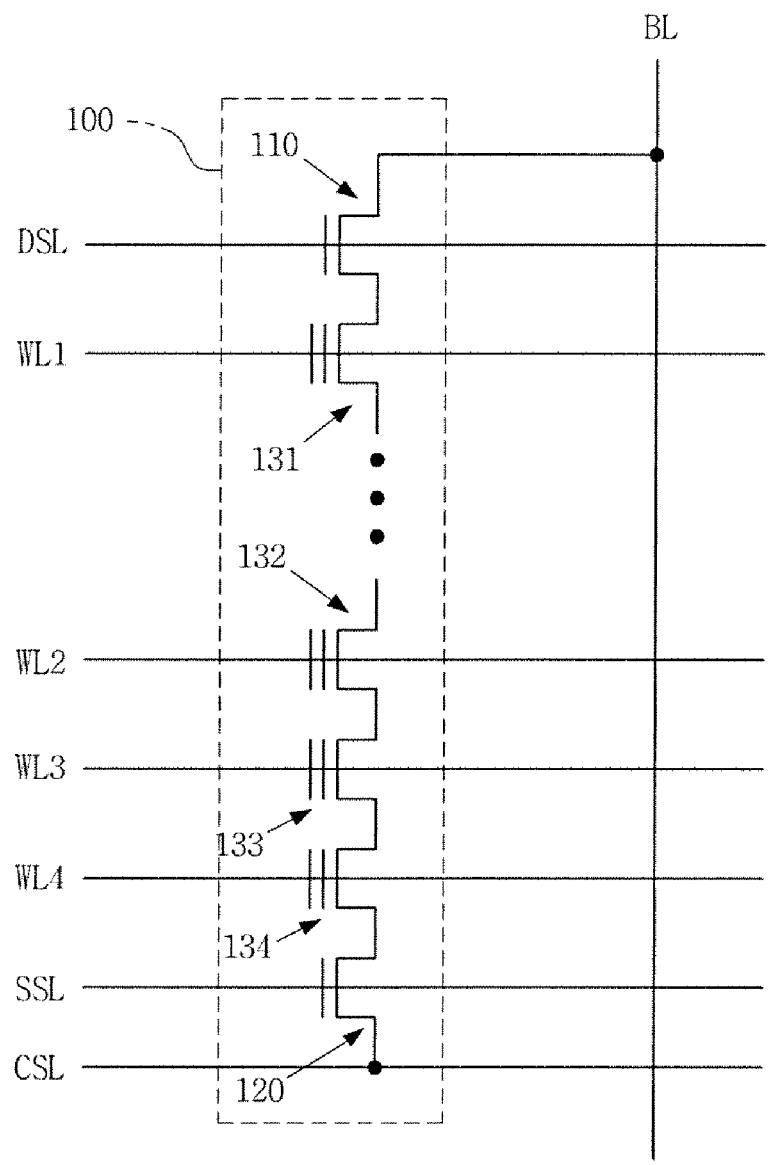
FIG. 1 illustrates a string structure of a conventional NAND flash memory device.
Figure 2:
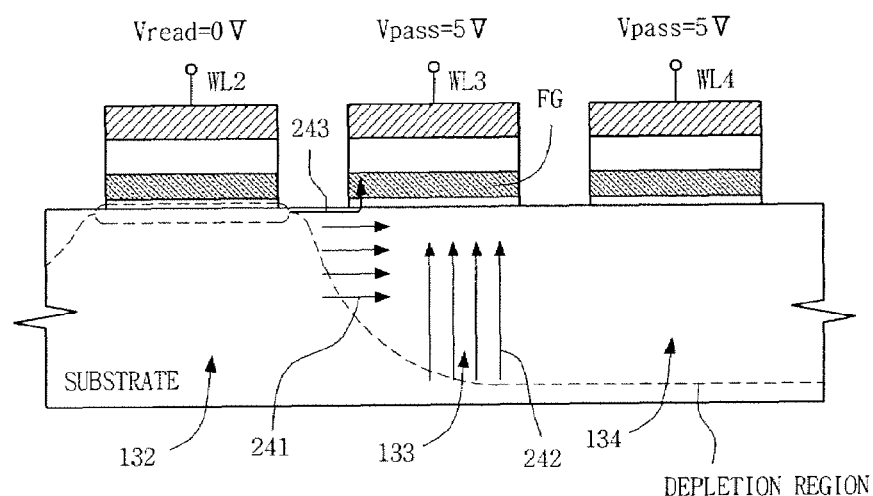
FIG. 2 illustrates a sectional view of the string structure of FIG. 1 and a read disturb phenomenon.
Figure 3:
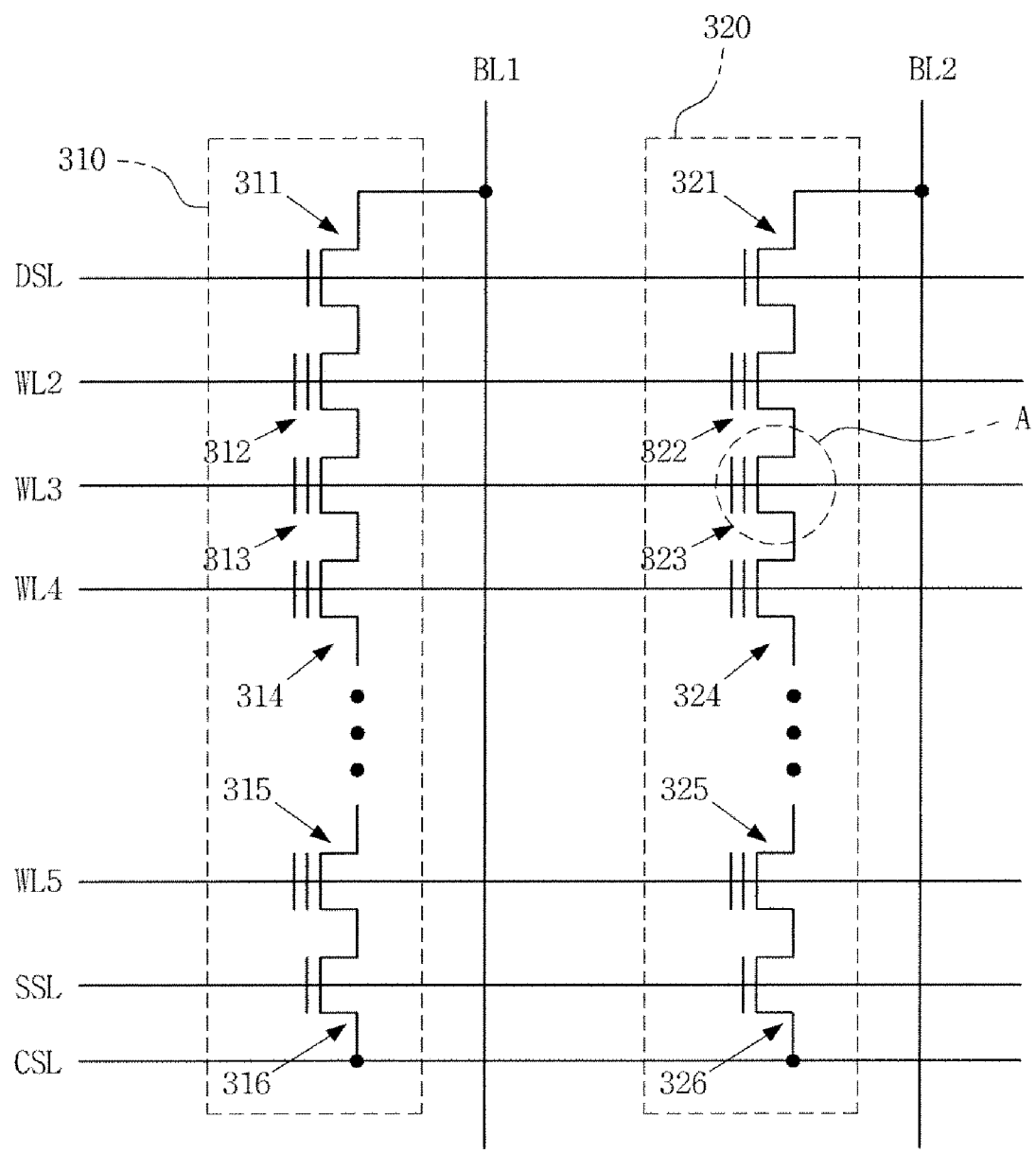
FIG. 3 illustrates a method of reading a NAND flash memory device.
Figure 4:
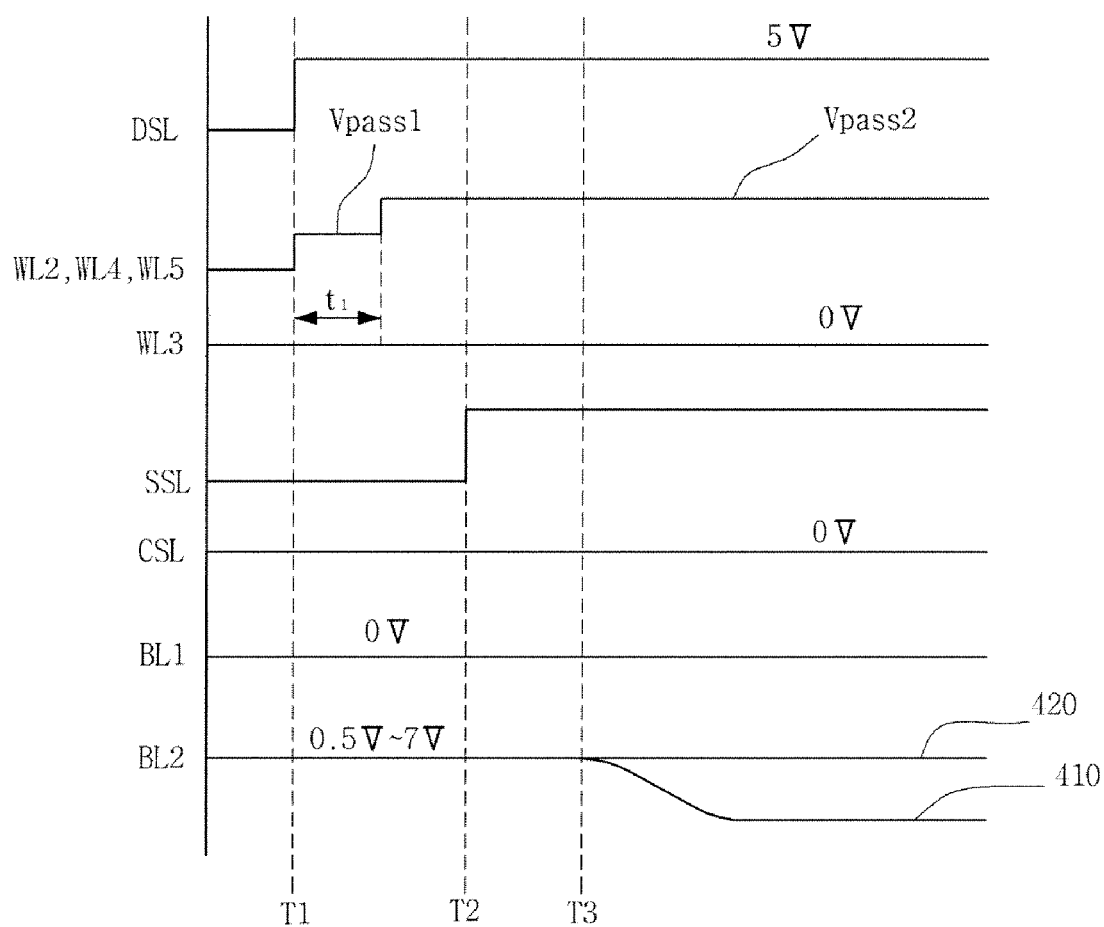
FIG. 4 illustrates a timing diagram of the NAND flash memory device of FIG. 3 and a method of reading a flash memory device according to one embodiment of the present invention.

FIG. 3 illustrates a method of reading a NAND flash memory device. FIG. 4 illustrates a timing diagram of a NAND flash memory device of FIG. 3 and a method of reading a flash memory device according to one embodiment of the present invention. Referring to FIG. 3, a first cell string 310 is connected to a first bit line BL1. The first cell string 310 includes a first drain select transistor 311, a plurality of memory cells 312, 313, 314, and 315, and a first source select transistor 316, which are all connected in series. The first bit line BL1 is connected to a drain of the first drain select transistor 311. A source of the first source select transistor 316 is connected to a common source line CSL. A second cell string 320 is connected to a second bit line BL2. The second cell string 320 includes a second drain select transistor 321, a plurality of memory cells 322, 323, 324, and 325, and a second source select transistor 326, which are all connected in series. The second bit line BL2 is connected to a drain of the second drain select transistor 321. A source of the second source select transistor 326 is connected to the common source line CSL.

The gates of the first and second drain select transistors 311 and 321 are commonly connected to a drain select line DSL. The gates of the first and second source select transistors 316 and 326 are commonly connected to a source select line SSL. A word line WL2 is connected to control gates of the memory cells 312 and 322. A word line WL3 is connected to control gates of the memory cells 313 and 323. A word line WL4 is connected to control gates of the memory cells 314 and 324. A word line WL5 is connected to control gates of the memory cells 315 and 325. As illustrated in FIG. 4, the bit lines BL1 and BL2 and the corresponding cell strings 310 and 320 constitute respective columns in a memory cell array. The word lines WL2, WL3, WL4, and WL5 constitute respective rows in the memory cell array.

According to the memory cell array with the above structure, a method of reading a state (i.e., a programmed state or an erased state) of the memory cell 323 in a dotted circle A will be described with reference to the timing diagram of FIG. 4.

Although not illustrated in FIG. 4, a bit line is precharged. The selected second bit line BL2 connected to the second cell string 320 including the selected memory cell 323 is precharged between approximately 0.5 V and 7 V, to be approximately 1 V, for example. The remaining unselected first bit line BL1 other than the selected second bit line BL2 is approximately ground voltage, for example 0 V. Next, a predetermined level voltage, e.g., a drain select transistor's turn-on voltage of approximately 5 V is applied to the drain select line DSL at a first time point T1. Due to the turn-on voltage, the second drain select transistor 321 is turned on. Additionally, approximately ground voltage, for example 0 V is applied to the word line WL3 of the selected memory cell 323 at the first time point T1, and a pass voltage is applied to the word lines WL2, WL4, and WL5 of the unselected memory cells 322, 324, and 325. A rising edge of a pass voltage pulse simultaneously occurs when the rising edge in a pulse of a turn-on voltage applied to the drain select line DSL occurs. This pass voltage has a level that can turn on the unselected transistors 322, 324, and 325, whether or not they have been programmed.

The applying of the pass voltage includes applying a first pass voltage Vpass1 and applying a second pass voltage Vpass2. That is, when the first pass voltage Vpass1 is primarily applied, the rising edge in a pulse of the first pass voltage simultaneously occurs when the rising edge in a pulse of the turn-on voltage applied to the drain select line DSL occurs. The first pass voltage Vpass1 is sufficiently high enough to be able to turn on the unselected transistors 322, 324, and 325, regardless of whether or not they have been programmed, and able to boost their channels, while not forming a strong vertical electric field. For example, when approximately 3 V is applied as the first pass voltage Vpass1, the channels of the unselected memory cells 322, 324, and 325 are boosted below approximately 2.4 V, so that a horizontal electric field is maintained and electrons in the channel of the selected memory cell 323 are prevented from changing into hot carriers. Accordingly, the read disturb phenomenon due to the hot carriers can be prevented at duration t1 of when the first pass voltage Vpass1 is applied. The level of the first pass voltage Vpass1 ranges between approximately 1.5 and approximately 4 V. The duration t1 ranges between approximately 10 ns and approximately 0.1 ms.

After the first pass voltage Vpass1 is applied to the word lines WL2, WL4, and WL5 of the memory cells 322, 324, and 325 that are not selected at the duration t1, the second pass voltage Vpass2 is applied to word lines WL2, WL4, and WL5 of the unselected memory cells 322, 324, and 325. The second pass voltage Vpass2 is a conventional pass voltage, e.g., approximately 5 V, which is higher than the first pass voltage Vpass1. The rising edge in a pulse of a second pass voltage Vpass2 (or, the rising edge in a pulse of a first pass voltage Vpass1) occurs between a time point T1 of when the rising edge of a voltage applied to the drain select line DSL occurs and a time point T2 of when the rising edge of a voltage applied to the source select line SSL occurs.

Next, at a second time point T2 of when the second pass voltage Vpass2 is applied to the word lines WL2, WL4, and WL5 of the unselected memory cells 322, 324, and 325 and approximately ground voltage, for example 0 V is applied to the word line WL3 of the selected memory cell 323, a voltage for turning on the source select transistor 326 is applied to the source select line SSL. This uniformly maintains channel boosting of the unselected memory cells 322, 324, and 325, and also, occurrence of hot carriers can be prevented. In this case, when the selected memory cell 323 is turned on, a path is formed for transferring electric charges along the second cell string 320, but when the selected memory cell 323 is turned off, the path is not formed.

At a third time point T3 elapsing a predetermined time from the second time point T2, the electric charges precharged in the second bit line BL2 are discharged or maintain their states according to a state of the selected memory cell 323. That is, when the path is formed for transferring the electric charges along the second cell string 320, the electric charges precharged in the second bit line BL2 are discharged into the cell source line CSL, as illustrated in 410 of FIG. 4. On the other hand, when the path is not formed for transferring the electric charges along the second cell string 320, the electric charges precharged in the second bit line BL2 can not be discharged and maintain their states as illustrated in 420 of FIG. 4. Accordingly, it can be determined whether the second bit line BL2 is discharged or not. If the second bit line BL2 is discharged, this means that the selected memory cell 323 is turned on. Therefore, it is determined that the selected memory cell 323 is in an erased state. On the contrary, if it is not discharged, the selected memory cell 323 is turned off. Therefore, it is determined that the selected memory cell 323 is in a programmed state. It is more accurate to determine whether the second bit line BL2 is discharged or not after a sufficient evaluation time has elapsed.

According to the method for reading a NAND flash memory device, the pass voltage applied to the word line of the unselected memory cell is applied in two operations. For that reason, hot carriers do not occur in the channel of the selected memory cell while maintaining channel boosting. Accordingly, the read disturb phenomenon of the adjacent memory cell, which is caused due to hot carriers, can be prevented. Furthermore, the reliability and retention property of a device can be improved.

While the present invention has been described with respect to the specific embodiments, it will be apparent to those skilled in the art that various changes and modifications may be made without departing from the spirit and scope of the invention as defined in the following claims.

What is claimed is:

1. A method for reading a NAND flash memory device with a cell string, the cell string including a drain select transistor, a plurality of memory cells, and a source select transistor, which are all connected in series, the method comprising:
    applying a first voltage to a gate of the drain select transistor to turn on the drain select transistor;
    applying a read voltage to a gate of a selected memory cell; and
    applying a pass voltage to gates of unselected memory cell, wherein the applying of the pass voltage includes:
    applying a first pass voltage; and
    applying a second pass voltage after an elapse of a predetermined time following the applying of the first pass voltage, the second pass voltage having a level different from that of the first pass voltage.

2. The method of claim 1, wherein the first pass voltage is simultaneously applied when the first voltage is applied to turn on the drain select transistor.

3. The method of claim 1, wherein a level of the second pass voltage is set to be higher than that of the first pass voltage.

4. The method of claim 1, wherein the first pass voltage turns on the unselected memory cells and is in a range that prevents hot carriers from occurring in a channel of the selected memory cell.

5. The method of claim 4, wherein the first pass voltage is between about 1.5 V and about 4 V.

6. The method of claim 1, wherein the applying of the first pass voltage lasts between about 10 ns and about 0.1 ms.

7. The method of claim 1, further comprising applying a second voltage to a gate of the source select transistor to turn on the source select transistor.

8. The method of claim 7, wherein the second pass voltage is applied before the second voltage is applied to turn on the source select transistor.

9. The method of claim 1, further comprising:
applying a precharge voltage to a selected bit line connected to a cell string including the selected memory cell; and
applying ground voltage to unselected bit lines connected to remaining cell strings except for the cell string including the selected memory cell.

10. The method of claim 9, wherein the precharge voltage is set to be between about 0.5 V and about 7 V.

11. A method for reading a NAND flash memory device with a cell string, the cell string including a drain select transistor, a plurality of memory cells, and a source select transistor, which are all connected in series, the drain select transistor including a cell string connected to each bit line, the method comprising:
applying a precharge voltage to a selected bit line, the selected bit line being connected to a cell string including a selected memory cell;
applying ground voltage to remaining bit lines except for the selected bit line;
applying a first voltage to a gate of the drain select transistor to turn on the drain select transistor;
applying a read voltage to a gate of a selected memory cell among the plurality of memory cells; and
applying a pass voltage to each gate of unselected memory cell among the plurality of memory cells to turn on the unselected memory cell,
wherein the applying of the pass voltage includes:
applying a second pass voltage after an elapse of a predetermined time following the applying of the first pass voltage, the second pass voltage having a level different from that of the first pass voltage;
applying a second voltage to a gate of the source select transistors to turn on the source select transistor; and
detecting a voltage change of the selected bit line to determine whether the selected memory cell is in a programmed state or an erased state.

12. The method of claim 11, wherein the first pass voltage is simultaneously applied when the first voltage is applied to turn on the drain select transistor.

13. The method of claim 11, wherein a level of the second pass voltage is set to be higher than that of the first pass voltage.

14. The method of claim 13, wherein the first pass voltage is simultaneously applied when the first voltage is applied to turn on the drain select transistor.

15. The method of claim 13, wherein the first pass voltage turns on the unselected memory cells and is in a range that prevents hot carriers from occurring in a channel of the selected memory cell.

16. The method of claim 15, wherein the first pass voltage is set to be between about 1.5 V and about 4 V.

17. The method of claim 11, wherein the first pass voltage turns on the unselected memory cells and is in a range that prevents hot carriers from occurring in a channel of the selected memory cell.

18. The method of claim 17, wherein the first pass voltage is set to be between about 1.5 V and about 4 V.

19. The method of claim 11, wherein the second pass voltage is applied before the second voltage is applied to turn on the source select transistor.

20. A method for reading a NAND flash memory device with a cell string, the cell string including a drain select transistor, a plurality of memory cells, and a source select transistor, which are all connected in series, the drain select transistor including a cell string connected to each bit line, the method comprising:
applying a precharge voltage to a selected bit line, the selected bit line being connected to a cell string including a selected memory cell;
applying ground voltage to remaining bit lines except for the selected bit line;
applying a first voltage to a gate of the drain select transistor to turn on the drain select transistor;
applying a read voltage to a gate of a selected memory cell among the plurality of memory cells; and
applying a pass voltage to each gate of unselected memory cell among the plurality of memory cells to turn on the unselected memory cell,
wherein the applying of the pass voltage includes:
applying a second pass voltage after an elapse of a predetermined time following the applying of the first pass voltage, the second pass voltage is higher than that of the first pass voltage;
applying a second voltage to a gate of the source select transistors to turn on the source select transistor; and
detecting a voltage change of the selected bit line to determine whether the selected memory cell is in a programmed state or an erased state.

* * * * *